(12) United States Patent
Joo et al.

(10) Patent No.: US 7,460,428 B2
(45) Date of Patent: Dec. 2, 2008

(54) DYNAMIC RANDOM ACCESS MEMORY AND COMMUNICATIONS TERMINAL INCLUDING THE SAME

(75) Inventors: Jae-hoon Joo, Seongnam-si (KR);
Sang-seok Kang, Suwon-si (KR);
Byung-heon Kwak, Suwon-si (KR);
Kang-young Cho, Suwon-si (KR);
Chang-hag Oh, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 153 days.

(21) Appl. No.: 11/482,141

(22) Filed: Jul. 7, 2006

(65) Prior Publication Data

US 2007/0008802 A1 Jan. 11, 2007

(30) Foreign Application Priority Data

Jul. 11, 2005 (KR) .................. 10-2005-0062355

(51) Int. Cl.
*G11C 7/00* (2006.01)

(52) U.S. Cl. ..................... 365/226; 365/229

(58) Field of Classification Search ............... 365/226, 365/229, 189.11
See application file for complete search history.

(56) References Cited

U.S. PATENT DOCUMENTS

| | | | |
|---|---|---|---|
| 7,123,522 B2 * | 10/2006 | Ho et al. | 365/189.11 |
| 2002/0159322 A1 * | 10/2002 | Choi et al. | 365/226 |
| 2002/0191467 A1 * | 12/2002 | Matsumoto et al. | 365/222 |
| 2005/0281112 A1 * | 12/2005 | Ito et al. | 365/222 |

FOREIGN PATENT DOCUMENTS

| | | |
|---|---|---|
| JP | 2001-338489 | 12/2001 |
| KR | 10-1998-0013997 | 5/1998 |
| KR | 100173953 | 11/1998 |
| KR | 1020040044421 | 5/2004 |

* cited by examiner

*Primary Examiner*—Vu A Le
(74) *Attorney, Agent, or Firm*—Volentine & Whitt, PLLC

(57) ABSTRACT

Provided is a DRAM having reduced current consumption and a communication terminal including the same. The DRAM includes a plurality of memory banks capable of being independently supplied with power, and a DPD controller for selectively causing some of the plurality of memory banks to enter a DPD mode.

21 Claims, 7 Drawing Sheets

DYNAMIC RANDOM ACCESS MEMORY AND COMMUNICATIONS TERMINAL INCLUDING THE SAME

BACKGROUND OF THE INVENTION

1. Field of the Invention

Embodiments of the invention relate to a dynamic random access memory (DRAM) adapted for use in a communication terminal. More particularly, embodiments of the invention relate to a DRAM having reduced current consumption adapted for use in a communication terminal.

This application claims priority from Korean Patent Application No. 10-2005-0062355 filed on Jul. 11, 2005, the subject matter of which is hereby incorporated by reference in its entirety.

2. Description of the Related Art

According to recent trends in highly integrated, large capacity semiconductor memory devices, a plurality of memory banks are commonly incorporated into a single memory chip. Recently, multimedia features such as online games, an MPEG audio layer-3 (MP3) function, video streaming, and a global positioning system (GPS) function have been added to newly developed communication terminals. These communication terminals typically include an integrated processor adapted to process communication data and multimedia data in conjunction with a DRAM. In this capacity, the DRAM is used to temporarily store the data passing to/from the integrated processor. In a DRAM including multiple memory banks, some memory banks may be used for communication functions and related data, and other memory banks may be used for multimedia functions and related data.

Conventional communication terminals generally spend only short periods of time executing multimedia functions. Thus, communication terminals use only relatively small amounts of power (e.g., draw small amounts of current) while executing multimedia functions and the memory banks associated with multimedia functions and related data spend a great deal of operational time in a standby mode in which current drain is limited to only several hundreds of microamperes (μA). However, even this limited amount of power consumption has fallen under scrutiny as contemporary communication terminals face greater demands for battery life and overall operating performance.

SUMMARY OF THE INVENTION

In certain embodiments of the invention, a DRAM is provided in which some memory banks maintain an active state or a data retention state through a self-refresh mode while other memory banks operate in a deep power down (DPD) mode in which power consumption is reduced over the conventional standby mode. In this manner, embodiments of the invention seek to minimize power consumption by an integrated processor and an associated DRAM.

In one embodiment, the invention provides a dynamic random access memory (DRAM) comprising; a plurality of memory banks, each one independently supplied with a power supply voltage and adapted to operate in a deep power down (DPD) mode, and a DPD controller adapted to select a memory bank from the plurality of memory banks and cause the selected memory bank to enter into the DPD mode.

In another embodiment, the invention provides a dynamic random access memory (DRAM) comprising; a plurality of memory banks, each one independently supplied with a power supply voltage and adapted to operate in a deep power down (DPD) mode, a plurality of internal power supply voltage sections, each one arranged in relation to a corresponding one of the plurality of memory banks and adapted to provide an internal power supply voltage thereto, and a DPD controller adapted to selectively disable the plurality of internal power supply voltage section, wherein a memory bank corresponding to a disabled internal power supply voltage section enters into the DPD mode.

In yet another embodiment, the invention provides a communication terminal comprising; an integrated processor adapted to process communication data and multimedia data, and a dynamic random access memory (DRAM) adapted to receive and temporarily storing data associated with the integrated processor, wherein the DRAM comprises a plurality of memory banks, each one independently supplied with a power supply voltage and adapted to operate in a deep power down (DPD) mode, and a DPD controller adapted to select a memory bank from the plurality of memory banks to enter into the DPD mode.

DESCRIPTION OF EXEMPLARY EMBODIMENTS

Figure 1:
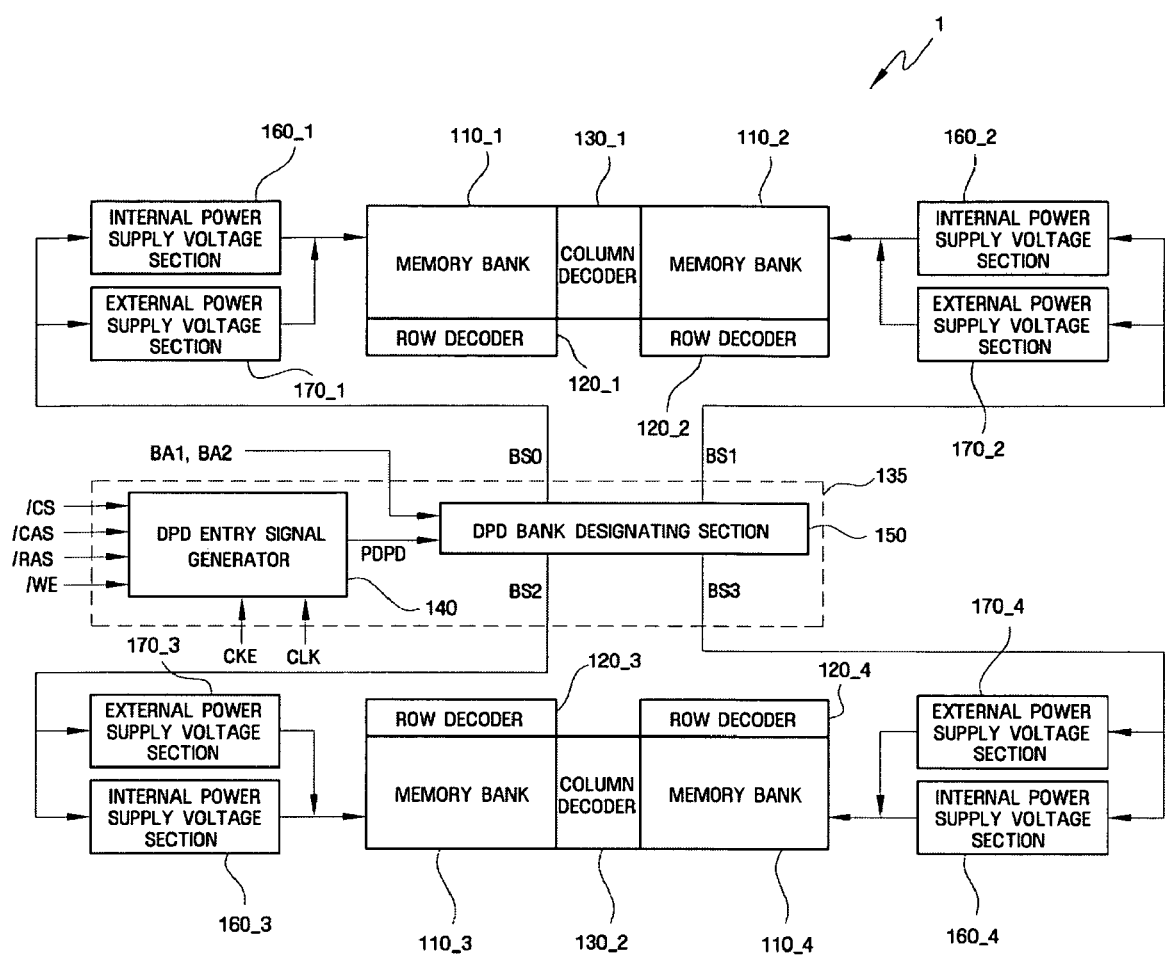
FIG. 1 is a block diagram of a DRAM according to an embodiment of the invention.

Advantages and features of the present invention will be understood more readily from the following description of exemplary embodiments made with reference to the accompanying drawings. The present invention may, however, be embodied in many different forms and should not be construed as being limited to only the embodiments set forth herein. Rather, these embodiments are provided as teaching examples. Like reference numerals refer to like elements throughout the specification.

FIG. 1 is a block diagram of a DRAM 1 according to an embodiment of the invention. For brevity, while the embodiment illustrated in FIG. 1 will be described in the context of four (4) memory banks, the present invention is not limited to this particular example, and any type of semiconductor memory device having any reasonable number of memory banks may incorporate the advantages of the invention.

Referring to FIG. 1, DRAM 1 comprises memory banks 110_1, 110_2, 110_3, and 110_4, row decoders 120_1, 120_2, 120_3, and 120_4, column decoders 130_1 and 130_2, a deep power down (DPD) controller 135, internal power supply voltage sections 160_1, 160_2, 160_3, and 160_4, and external power supply voltage sections 170_1, 170_2, 170_3, and 170_4.

Each memory bank 110_1, 110_2, 110_3, and 110_4 comprises a plurality of memory cells arranged in a matrix. Each row decoder 120_1, 120_2, 120_3, and 120_4 is arranged in relation to corresponding memory banks 110_1, 110_2, 110_3, and 110_4 and is adapted to designate row addresses in memory banks 110_1, 110_2, 110_3, and 110_4. For example, first row decoder 120_1 selects a row address for first memory bank 110_1. Each column decoder 130_1 and 130_2 is arranged in relation to two (2) corresponding memory banks 110_1, 110_2, 110_3, and 110_4 and is adapted to designate column addresses for the corresponding memory banks 110_1, 110_2, 110_3, and 110_4. For example, first column decoder 130_1 selects column addresses for first memory bank 110_1 and second memory bank 110_2.

DPD controller 135 is adapted to select from memory banks 110_1, 110_2, 110_3, and 110_4 and is further adapted to cause a selected memory bank to enter a deep power down (DPD) mode. Selection by DPD controller 135 may be accomplished in response to a command designated by a combination of control signals. For example, in one illustrative embodiment, DPD control 135 is adapted to disable one or more internal power supply voltages otherwise supplied by internal power supply voltage sections 160_1, 160_2, 160_3, and 160_4, thereby placing selected ones of memory banks 110_1, 110_2, 110_3, and 110_4 into the DPD mode. However, different mechanisms may be equivalently used to effectively power-disable a selected memory bank and place it in the DPD mode.

In the illustrated embodiment, DPD controller 135 comprises a DPD entry signal generator 140 and a DPD bank designating section 150. DPD entry signal generator 140 detects entry of a memory bank into the DPD mode, and provides a DPD command signal PDPD in response to the detection. In other words, upon detecting memory bank entry into the DPD mode, the DPD command signal PDPD is activated (e.g., placed in a logically high state). An exemplary circuit and related operational timing for DPD entry signal generator 140 will be described in some additional detail with reference to FIGS. 2 and 3.

DPD bank designating section 150 is enabled by the DPD command signal PDPD and provides DPD bank designation signals BS0, BS1, BS2, and BS3 for respectively designating memory banks 110_1, 110_2, 110_3, and 110_4 intended to enter into the DPD mode. In one particular example, DPD bank designating section 150 may be adapted to decode predetermined address signals BA1 and BA2, (e.g., the most significant bits of a larger address signal), and thereby provide the appropriate DPD bank designation signal BS0, BS1, BS2, and BS3. An exemplary DPD bank designating section 150 will be described in some additional detail hereafter with reference to FIG. 4.

Internal power supply voltage sections 160_1, 160_2, 160_3, and 160_4 are arranged in relation to a corresponding memory bank 110_1, 110_2, 110_3, and 110_4, and are adapted to provide internal power supply voltages to the corresponding memory bank 110_1, 110_2, 110_3, and 110_4. Each internal power supply voltage section 160_1, 160_2, 160_3, and 160_4 may include a boost voltage circuit, a back-bias voltage generator, and an internal power supply voltage circuit. These constituent circuits are conventionally understood. Each internal power supply voltage section 160_1, 160_2, 160_3, and 160_4 may include one or more internal circuits of conventional design.

According to one embodiment of the invention, internal power supply voltage sections 160_1, 160_2, 160_3, and 160_4 are enabled and disabled by respective high and low states for DPD bank designation signals BS0, BS1, BS2, and BS3. Selected memory banks from memory banks 110_1, 110_2, 110_3, and 110_4 associated with a disabling DPD bank designation signals BS0, BS1, BS2, and BS3 enter into the DPD mode. Only the memory banks associated with an enabling DPD bank designation signals BS0, BS1, BS2, and BS3 remain in actual use, thereby minimizing overall power consumption of DRAM 1.

Of further note in the illustrated embodiment, each internal power supply voltage section 160_1, 160_2, 160_3, and 160_4 is electrically independent from all memory banks other than its corresponding memory bank. For example, internal power supply voltages generated by first internal power supply voltage section 160_1 are provided to only its corresponding first memory bank 110_1 through one or more internal power supply voltage line(s) connecting first internal power supply voltage section 160_1 and first memory bank 110_1. Memory banks 110_2, 110_3, and 110_4 have no power supply voltage relationship to first internal power supply voltage section 160_1.

Exemplary internal power supply voltage sections 160_1, 160_2, 160_3, and 160_4 will be described in some additional detail with reference to FIG. 5.

External power supply voltage sections 170_1, 170_2, 170_3, and 170_4 are adapted to provide external power supply voltages corresponding ones of memory banks 110_1, 110_2, 110_3, and 110_4 that have entered into the DPD mode. Thus, external power supply voltage sections 170_1, 170_2, 170_3, and 170_4 may be enabled by DPD bank designation signals BS0, BS1, BS2, and BS3 in a low state.

In one embodiment, external power supply voltage sections 170_1, 170_2, 170_3, and 170_4 provide external power supply voltages to the boost voltage input terminals of memory banks 110_1, 110_2, 110_3, and 110_4 placed into the DPD mode. As is conventionally understood, a boost voltage may be used by a word line driver, a bit line isolator circuit, and/or a data output buffer provided within memory banks 110_1, 110_2, 110_3, and 110_4. For example, a boost voltage may be applied to the pickup contact of certain PMOS transistors associated with referenced circuits in the memory banks. If the boost voltage drops below a predetermined voltage level while a corresponding memory bank is in DPD mode, a forward diode between an N-type well and P-type source/drain regions of the PMOS transistor may be turned ON. To prevent the forward diode from being turned ON, it is necessary to maintain the boost voltage level associated with a memory bank in DPD mode at a predetermined voltage level, (e.g., a voltage level other than ground at which the forward diode does not turn ON).

Where a boost voltage generated by enabled internal power supply voltage sections 160_1, 160_2, 160_3, and 160_4 is provided to a boost voltage input terminal of a disabled memory bank, a considerable amount of current may be consumed in the form of leakage current. As a result, in the illustrated embodiment of the invention, internal power supply voltage sections 160_1, 160_2, 160_3, and 160_4 are electrically independent of all memory banks except a corresponding memory bank, and each corresponding internal power supply voltage section 160_1, 160_2, 160_3, and 160_4 maintains boost voltage levels for its corresponding memory bank among memory banks 110_1, 110_2, 110_3, and 110_4 where it has entered into the DPD mode at external power supply voltage levels. Analogously, the boost voltage levels applied to the respective memory banks that have entered into the power down mode may also be set such that they may not cause the forward diode to be turned ON.

External power supply voltage sections 170_1, 170_2, 170_3, and 170_4 will be described in some additional detail with reference to FIG. 6.

Figure 2:
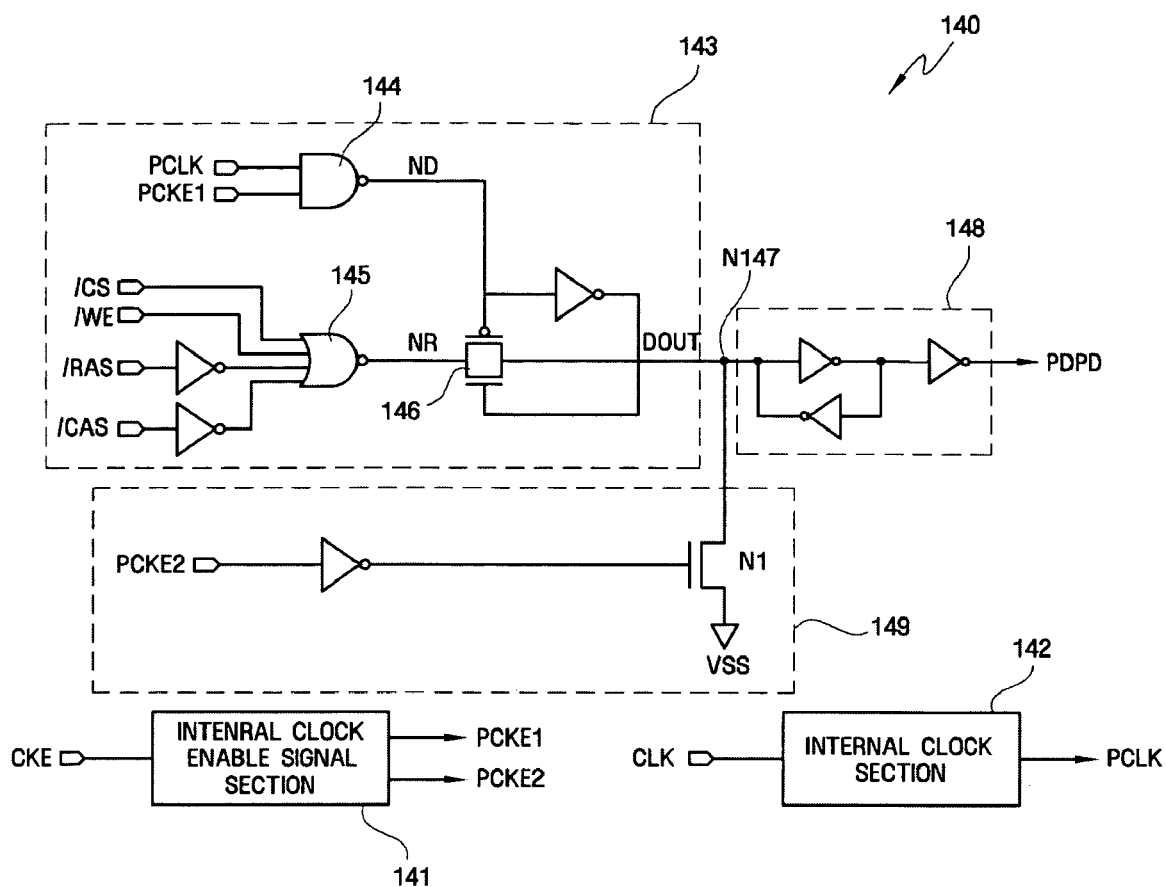
FIG. 2 is a circuit diagram of the DPD generator of FIG. 1.

FIG. 2 is a circuit diagram of an exemplary DPD entry signal generator 140, as shown in FIG. 1. Referring to FIG. 2, DPD entry signal generator 140 comprises an internal clock enable signal section 141, an internal clock section 142, an entry detection unit 143, a latch unit 148, and an exit detection unit 149.

Internal clock enable signal section 141 is adapted to provide a first internal clock enable signal PCKE1 and a second internal clock enable signal PCKE2 in response to a clock enable signal CKE. Internal clock section 142 is adapted to provide an internal clock PCLK in response to a clock CLK.

Entry detection unit 143 is adapted to detect entry of a memory bank into the DPD mode in response to certain control signals. In the illustrated example, entry detection unit 143 comprises a transmission gate 146 gated by a NANDed combination signal ND of the internal clock signal PCLK and the first internal clock enable signal PCKE1 and adapted to selectively transmit a NORed combination signal NR of a chip select signal /CS, a write enable signal /WE, an inverted signal of a row address strobe signal /RAS, and an inverted signal of a column address strobe signal /CAS.

Latch unit 148 is adapted to latch an output DOUT signal from entry detection unit 143 and subsequently provide the DPD command signal PDPD.

Exit detection unit 149 is adapted to detect the exit of a memory bank from the DPD mode in response to the second internal clock enable signal PCKE2. In the illustrated example, exit detection unit 149 is disposed between an output node N147 of entry detection unit 143 and ground voltage VSS, and comprises an NMOS transistor N1 gated by an inverted version of the second internal clock enable signal PCKE2. Thus, exit detection unit 149 allows the output signal DOUT of entry detection unit 143 to go low. Thus, latch unit 148 provides the DPD command signal PDPD at a low level.

Figure 3:
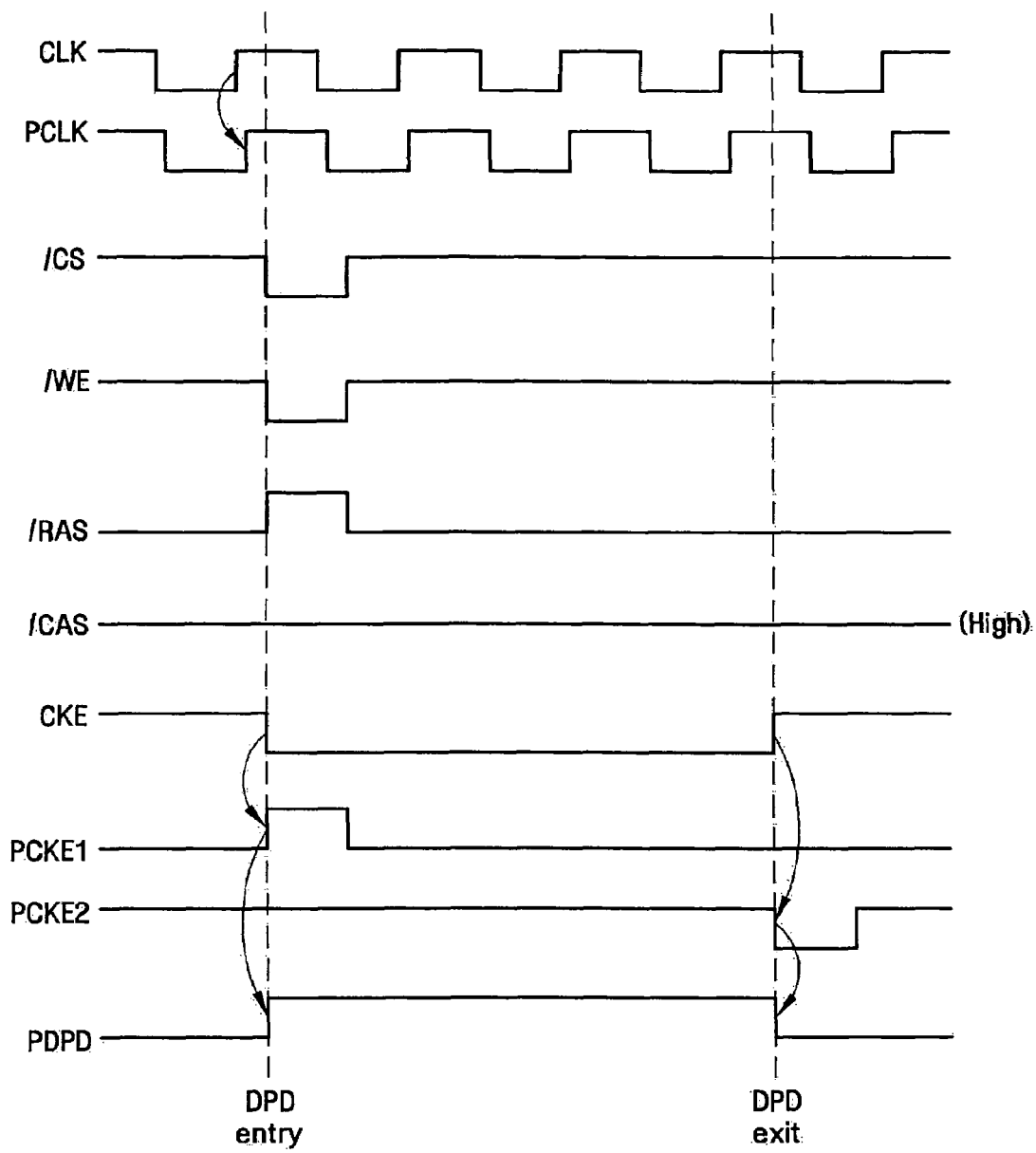
FIG. 3 is a timing diagram for explaining an operation of the DPD generator shown in FIG. 1.

Hereinafter, operation of the exemplary DPD entry signal generator 140 will be described with reference to FIGS. 2 and 3. The clock signal CLK is assumed to be a master clock for DRAM 1, and the internal clock PCLK is generated in response to a rising edge of the clock CLK. The clock enable signal CKE signals the validity of a next clock. In one embodiment of the invention, the clock enable signal CKE maintains a logically low state during entry of a memory bank into the DPD mode. The first internal clock enable signal PCKE1 goes high in response to a falling edge of the clock enable signal CKE and the second internal clock enable signal PCKE2 goes low in response to a rising edge of the clock enable signal CKE.

When the internal clock PCLK, the first clock enable signal PCKE1, the row address strobe signal /RAS, and the column address strobe signal /CAS are all high and the chip select signal /CS and the write enable signal /WE are low, DPD entry signal generator 140 provides a high DPD command signal PDPD signaling that at least one memory bank of DRAM 1 has entered into the DPD mode. More specifically, when logic levels of the row address strobe signal /RAS and the column address strobe signal /CAS are high and logic levels of the chip select signal /CS and the write enable signal /WE are low, the NOR signal goes high. At this time, the first clock enable signal PCKE1 goes high level when the internal clock signal PCLK is high, and thus the NAND signal ND is low and transmission gate 146 is turned ON. Thus, a high NOR signal NR is transmitted through transmission gate 146 and latched by latch unit 148, and the DPD command signal PDPD goes high.

Meanwhile, when the second clock enable signal PCKE2 goes low, the DPD entry signal generator 140 provides a low DPD command signal PDPD signaling the exit of one or more memory banks from the DPD mode. More specifically, when the second clock enable signal PCKE2 goes low, the NMOS transistor N1 is turned ON. Thus, the output signal DOUT goes low and is latched by latch unit 148, and the DPD command signal PDPD goes low.

Figure 4:
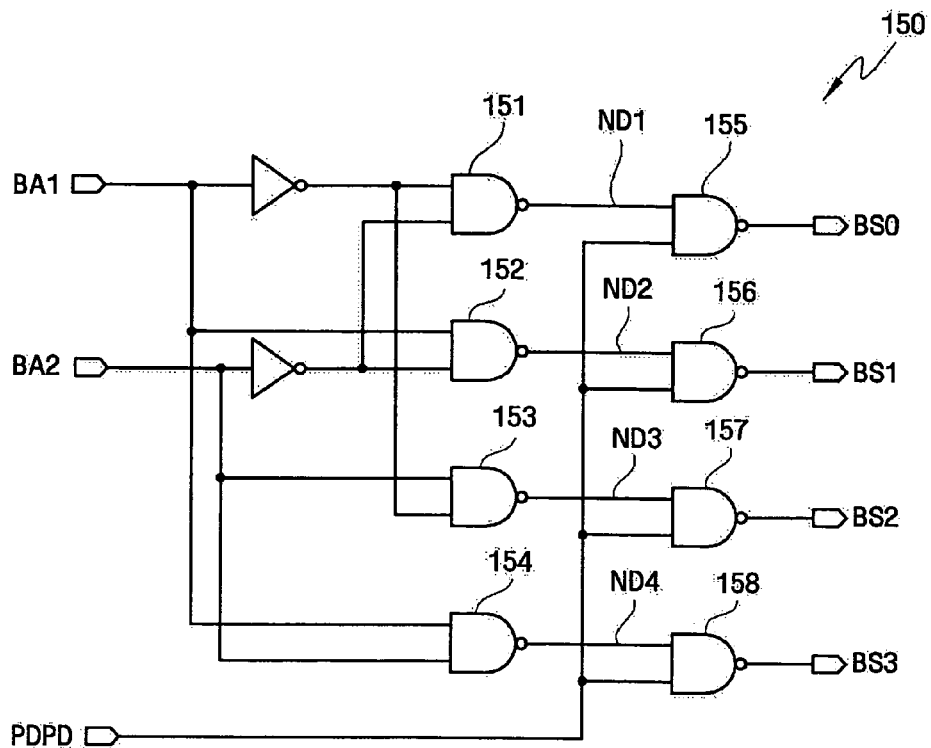
FIG. 4 is a circuit diagram of the DPD bank designating section of FIG. 1.

FIG. 4 is a circuit diagram further illustrating the exemplary DPD bank designating section 150 as shown in FIG. 1.

Referring to FIG. 4, DPD bank designating section 150 comprises four NAND operators 151, 152, 153, and 154 adapted to decode the address signals BA1 and BA2, and four NAND operators 155, 156, 157, and 158 receiving the DPD command signal PDPD and NAND signals ND1, ND2, ND3, and ND4 and providing the DPD bank designation signal BS0, BS1, BS2, and BS3.

As to one exemplary operation of DPD bank designating section 150, when both the address signal BA1 and the address signal BA2, are low while one or more memory banks are in the DPD mode, the NAND signal ND1 of the NAND operator 151 go low. Thus, the DPD bank designation signal BS0 goes high.

When the address signal BA1 is high and the address signal BA2 is low while one or more memory banks is in the DPD mode, the NAND signal ND2 of NAND operator 152 goes low. Thus, the DPD bank designation signal BS1 goes high.

When the address signal BA1 is low and the address signal BA2 is high while one or more memory banks are in the DPD mode, the NAND signal ND3 of NAND operator 153 goes low. Thus, the DPD bank designation signal BS2 goes high.

When both the address signal BA1 and the address signal BA2 are high while one or more memory banks are in the DPD mode, the NAND signal ND4 of NAND operator 154 goes low. Thus, the DPD bank designation signal BS3 goes high.

Figure 5:
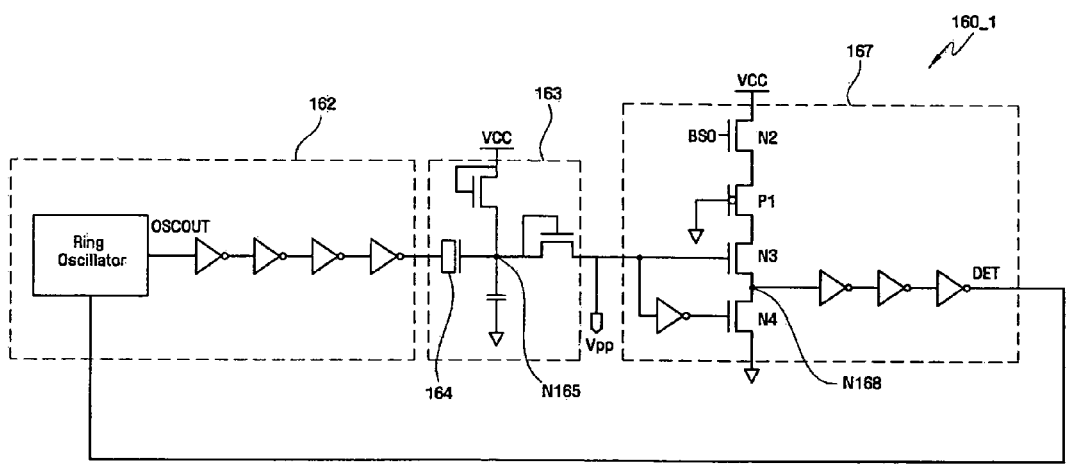
FIG. 5 is a circuit diagram of the internal power supply voltage section shown in FIG. 1.

FIG. 5 is an exemplary circuit diagram further illustrating the respective internal power supply voltage sections 160_x, as shown in FIG. 1. Taking first internal power supply voltage section 160_1 as a convenient example for purposes of illustration, this circuit comprises a pulse providing section 162, a main pump 163, and a boost voltage detection unit 167.

Pulse providing section 162 is adapted to provide an output signal OSCOUT in response to a low detection signal DET provided as a feedback signal. In one embodiment, pulse providing section 162 may comprise a ring oscillator.

Main pump 163 is adapted to provide a boost voltage VPP in response to the output signal OSCOUT. More specifically, main pump 163 precharges a boosting capacitor 164 to a predetermined voltage in response to a precharge signal. Next, charge from the pre-charged boosting capacitor 164 is pumped in response to the output signal OSCOUT of pulse providing section 162 to boost the voltage apparent at boosting node N165 to a predetermined voltage level. Although the boost voltage VPP is generated through one-time boosting in the illustrated embodiment, other conventionally understood voltage boosting methods may be alternatively used. For example, a plurality of boosting capacitors may be included and a boost voltage may be generated through a plurality of successive boosting operations. Using this approach the size of the boosting capacitors may be reduced and the boost voltage may be easily adjusted to the predetermined voltage level.

An NMOS transistor N2 of boost voltage detection unit 167 is turned ON in response to a high DPD bank designation signal BS0. When the level of the boost voltage VPP is higher than the level of a predetermined reference voltage, an NMOS transistor N3 is turned ON and a detection node N168 goes high. Thus, a low detection signal DET is fed back to pulse providing section 162.

When the level of the boost voltage VPP is lower than the level of the predetermined reference voltage, an NMOS transistor N4 is turned ON and the detection node N168 goes low. Thus, a high detection signal DET is fed back to pulse providing section 162. Although the level of the boost voltage VPP may be adjusted by controlling the resistances of a plurality of NMOS transistors N3 and N4, as shown in the illustrated embodiment, other methods may be used in the alternative. For example, a comparator may be used. The comparator may be adapted to receive the boost voltage VPP provided by main pump 163 and the reference voltage, comparing the levels of the boost voltage VPP and the reference voltage, and outputting the comparison result.

The NMOS transistor N2 of boost voltage detection unit 167 is turned OFF in response to a low DPD bank designation signal BS0. Thus, boost voltage detection unit 167 is disabled and corresponding memory bank 110_1 enters the DPD mode.

As such, since the internal power supply voltage section 160_1 corresponding to memory bank 110_1 has been disabled, consumption of current may be significantly reduced.

Figure 6:
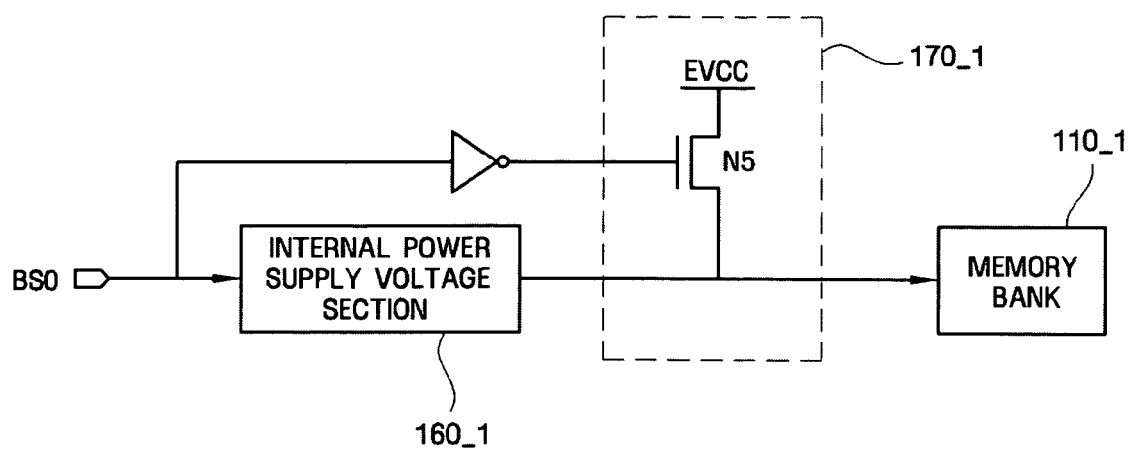
FIG. 6 is a circuit diagram of the external power supply voltage section of FIG. 1.

FIG. 6 is circuit diagram of an exemplary external power supply voltage section 170.x, as shown in FIG. 1. Referring to FIG. 6, first external power supply voltage section 170_1 is further described as a convenient example. This circuit is adapted to provide an external power supply voltage EVCC to corresponding memory bank 110_1, which is assumed to have entered into the DPD mode, as first internal power supply voltage section 160_1 is disabled in response to the DPD bank designation signal BS0. In particular, first external power supply voltage section 170_1 is adapted to deliver the external power supply voltage EVCC to a boost voltage input terminal of first memory bank 110_1. As described above, if the boost voltage VPP drops below a predetermined voltage level when being connected to a pickup contact for a PMOS transistor, for example, a forward diode between an N-type well and P-type source/drain regions of the PMOS transistor may be turned ON. Thus, even when memory bank 110_1 enters into the DPD mode, the boost voltage VPP should be maintained above the predetermined voltage level.

First external power supply voltage section 170_1 comprises a NMOS transistor N5 disposed between the external power supply voltage EVCC and the boost voltage input terminal of first memory bank 110_1. This transistor is gated by the DPD bank designation signal BS0. Thus, when the DPD bank designation signal BS0 is high, NMOS transistor N5 is turned OFF. When the DPD bank designation signal BS0 is low, NMOS transistor N5 is turned ON and provides external power supply voltage EVCC.

Since the boost voltage level of memory bank 110_1, as having entered into the DPD mode, is maintained at the level of the external power supply voltage EVCC, the implicated forward diode between N-type well and P-type source/drain regions of the PMOS transistor is not turned ON and leakage of current associated with the PMOS transistor may be reduced. Thus, DRAM 1 will stably operate in the DPD mode, thereby improving reliability.

Figure 7:
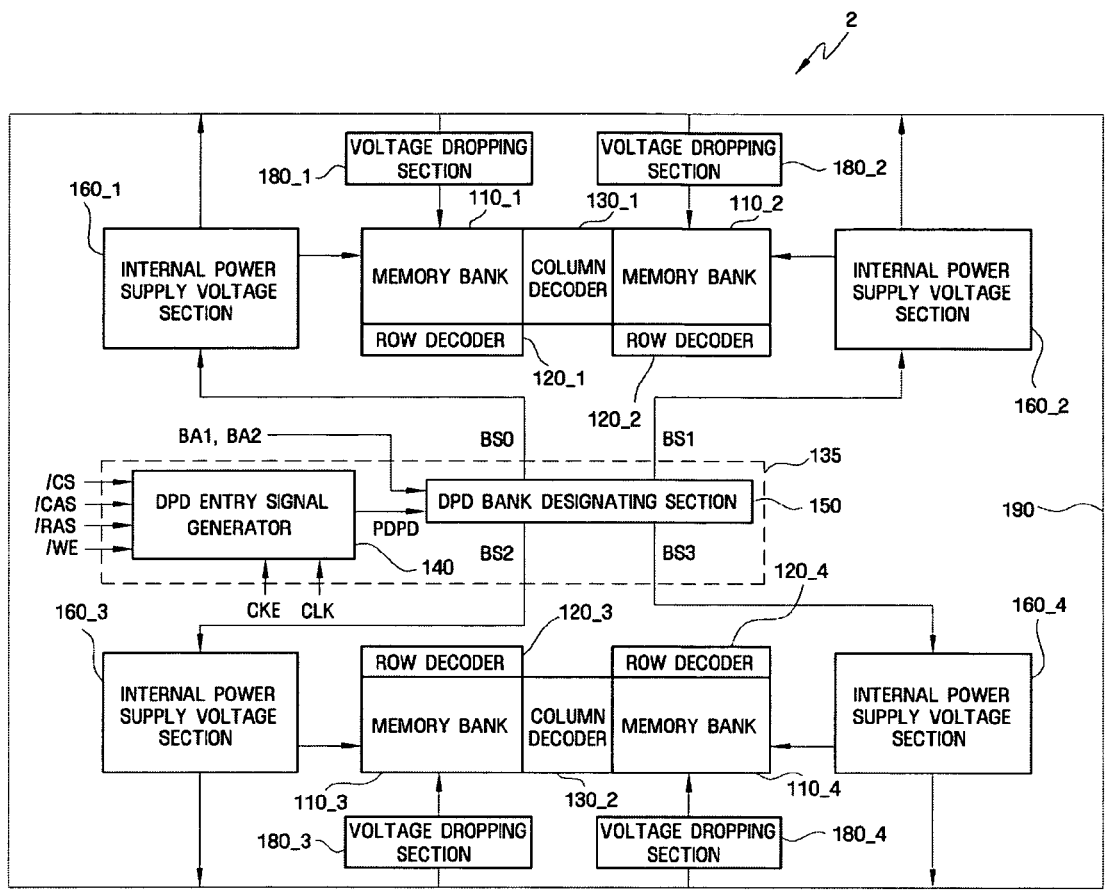
FIG. 7 is a block diagram of a DRAM according to another embodiment of the invention.

FIG. 7 is a block diagram of an exemplary DRAM 2 according to another embodiment of the invention. Substantially, the same constitutional elements as shown in FIG. 1 are represented by the same reference numerals, and thus, a detailed description thereof will not be given.

Referring to FIG. 7, DRAM 2 according to another embodiment of the present invention comprises a plurality of voltage dropping sections 180_1, 180_2, 180_3, and 180_4 each arranged in relation to corresponding ones of memory banks 110_1, 110_2, 110_3, and 110_4.

Each voltage dropping section 180_1, 180_2, 180_3, and 180_4 is adapted to drop a boost voltage VPP2 generated by an enabled internal power supply voltage section 160_1, 160_2, 160_3, and 160_4, (e.g., an internal power supply voltage section 160_x currently providing a predetermined voltage level in order to maintain the boost voltage levels of a corresponding memory bank 110_1, 110_2, 110_3, and 110_4 that has entered into the DPD mode higher than a predetermined voltage level). Each voltage dropping section 180_1, 180_2, 180_3, and 180_4 is further adapted to provide the dropped boost voltage VPP2 to boost voltage input terminals of one or more memory banks that have entered into the DPD mode. Since the generated boost voltage VPP2 is directly delivered to these memory banks, a considerable amount of current is consumed. Thus, to minimize consumption of current, prior to providing of the generated boost voltage VPP2, the predetermined voltage level should be reduced.

More specifically, the boost voltage VPP2 generated by an enabled second internal power supply voltage section 160_x is provided to a corresponding memory bank 110_x. A boost voltage line 190 routed around the plurality of memory banks 110_1, 110_2, 110_3, and 110_4 is provided, and the boost voltage VPP2 generated by an enabled internal power supply voltage section 160_x is dropped by a predetermined voltage level through operation of one more voltage dropping sections 180_x connected between boost voltage line 190 and a corresponding memory bank 110_x.

Figure 8:
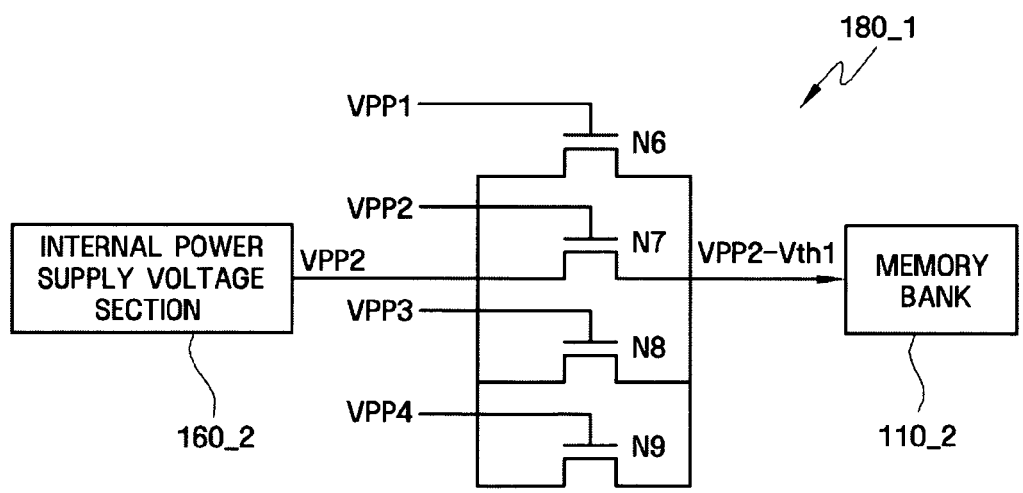
FIG. 8 is a circuit diagram of the voltage dropping section shown in FIG. 7.

FIG. 8 is a circuit diagram of an exemplary voltage dropping section 180_1, shown in FIG. 7. First voltage dropping section 180_1 is taken as a convenient example.

Referring to FIG. 8, the boost voltage VPP2 assumedly generated by enabled second internal power supply voltage section 160_2 is delivered to first memory bank 110_1 through first voltage dropping section 180_1. In the illustrated example, first voltage dropping section 180_1 comprises a plurality of NMOS transistors N6, N7, N8, and N9 connected in parallel between the enabled second internal power supply voltage section 160_2 and a boost voltage input terminal of first memory bank 110_1 having entered into the DPD mode. Gates of NMOS transistors N6, N7, N8, and N9 are connected to boost voltages VPP1, VPP2, VPP3, and VPP4 applied respectively to memory banks 110_1, 110_2, 110_3, and 110_4 of FIG. 7.

When first memory bank 110_1, third memory bank 110_3, and fourth memory bank 110_4 enter into the DPD mode, only second internal power supply voltage section 160_2 is enabled and first internal power supply voltage section 160_1, third internal power supply voltage section 160_3, and the fourth internal power supply voltage section 160_4 are disabled. Thus, boost voltages VPP1, VPP3, and VPP4 applied to first internal power supply voltage section 160_1, third internal power supply voltage section 160_3, and fourth internal power supply voltage section 160_4 remain at a ground voltage level. Only second NMOS transistor N7 is turned ON and first transistor N6, third transistor N8, and fourth transistor 9 are turned OFF. The boost voltage VPP2 is delivered to first memory bank 110_1 after being dropped by a threshold voltage Vth2 of second NMOS transistor N7.

While the boost voltage VPP2 generated by internal power supply voltage section 160_2 is dropped by the threshold voltage Vth2 through NMOS transistor N7, other conventionally understood methods may be used to effect a desired voltage drop.

Figure 9:
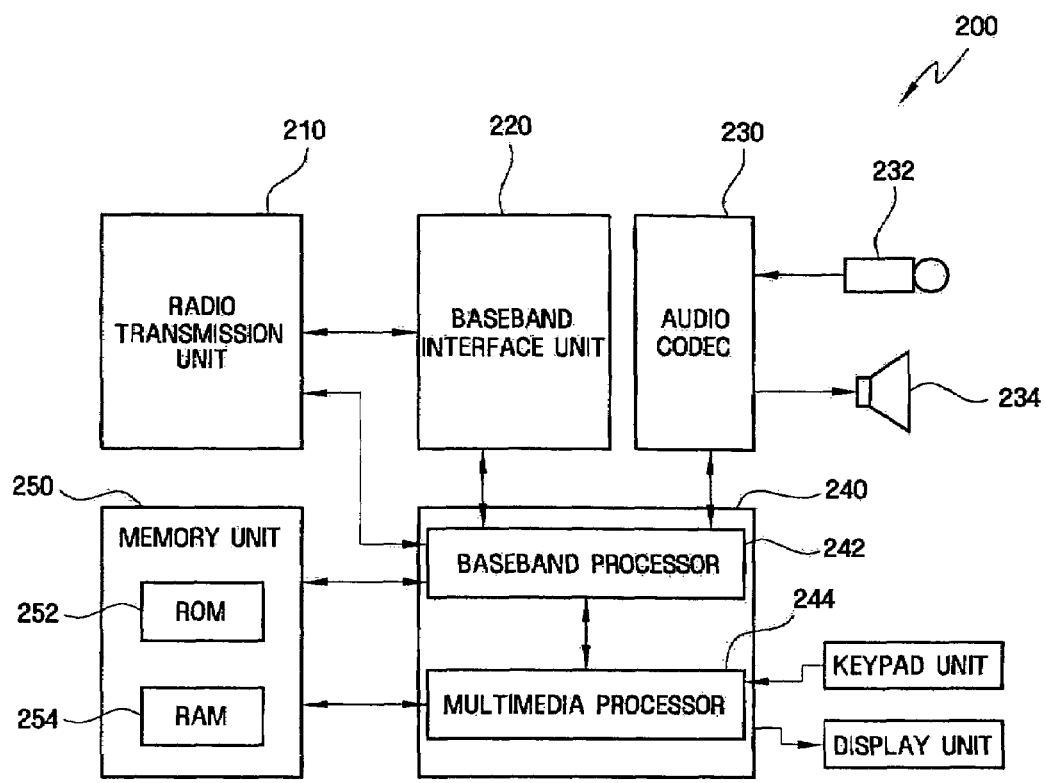
FIG. 9 is a schematic block diagram of a communication terminal including a DRAM according to embodiments of the invention.

FIG. 9 is a schematic block diagram of a communication terminal 200 comprising a DRAM according to an embodiment of the present invention. Exemplary communications terminal 200 is assumed to be a cellular phone. However, the advantages of the present invention may be applied to many other types of communication terminal.

Referring to FIG. 9, communication terminal 200 comprises a DRAM 254 according to an embodiment of the invention, a radio transmission section 210, a baseband interface unit 220, an audio codec 230, an integrated processor 240, and a memory unit 250. Radio transmission section 210 is adapted to receive a radio signal or converts audio data and multimedia data into a radio signal for transmission. Radio transmission section 210 may include a power section adapted to supply power required for operation of the constituent components of communication terminal 200.

Baseband interface unit 220 is adapted for use as an interface between radio transmission section 210 and a baseband processor 242. Audio codec 230 converts a user's voice input received through a microphone 232 into digital audio data or converts audio data into an analog signal and outputs the converted data to a speaker 234.

Communication terminal 200 is assumed to provided various multimedia functions such as online games, an MP3 function, video streaming, and a GPS functions. Thus, a superior processing capability aligned with these multimedia functions and related data is required. In addition, low power consumption with expanded bandwidth and increased security functionality is also required. To address these requirements, conventional communication terminals often integrate baseband processor 242 with a multimedia processor 244. Thus, communication terminal 200 comprises integrated processor 240 including baseband processor 242 and multimedia processor 244. Baseband processor 242 manages operations of baseband interface unit 220, audio codec 230, the radio transmission section 210 and controls communication, radio frequency, communication protocol, and conversion of an audio signal. Multimedia processor 244 supports functions such as e-mail, short message service transmission, audio transmission of radio communication and multimedia functions such as online games and an MP3 function.

Memory unit 250 comprises a read only memory (ROM) storage area 252 and a random access memory (RAM) storage area 254. ROM storage area 252 stores a portion of multimedia data and audio data and stores a command for performing a protocol decoding function, a timing function, a receiver control function, and a battery saver function.

RAM storage area 254 temporarily stores parameters and data from integrated processor 240 and multimedia command files. RAM storage area 254 may be a DRAM according to an embodiment of the invention. Minimization of power consumption is an important design consideration for communication terminal 200 as adapted to provide multimedia functions. Thus, when integrated processor 240 does not process multimedia data, it is not necessary to maintain all of the memory banks associated with RAM storage area 254 in standby mode. In other words, since memory banks other than the memory bank used by baseband processor 242 enter into the DPD mode, power consumption may be minimized.

While the present invention has been particularly described with reference to exemplary embodiments thereof, it will be understood by those of ordinary skill in the art that various changes in form and details may be made therein without departing from the scope of the invention as defined by the following claims.

What is claimed is:

1. A dynamic random access memory (DRAM) comprising:
   a plurality of memory banks, each one independently supplied with a power supply voltage and adapted to operate in a deep power down (DPD) mode; and
   a DPD controller adapted to select a memory bank from the plurality of memory banks and cause the selected memory bank to enter into the DPD mode.

2. The DRAM of claim 1, wherein the DPD controller is responsive to a combination of control signals.

3. A dynamic random access memory (DRAM) comprising:
   a plurality of memory banks, each one independently supplied with a power supply voltage and adapted to operate in a deep power down (DPD) mode;
   a plurality of internal power supply voltage sections, each one arranged in relation to a corresponding one of the plurality of memory banks and adapted to provide an internal power supply voltage thereto; and
   a DPD controller adapted to selectively disable the plurality of internal power supply voltage section, wherein a memory bank corresponding to a disabled internal power supply voltage section enters into the DPD mode.

4. The DRAM of claim 3, wherein each internal power supply voltage section comprises a boost voltage generator.

5. The DRAM of claim 3, wherein each internal power supply voltage sections is electrically independent from all memory banks in the plurality of memory banks, except for the corresponding memory bank.

6. The DRAM of claim 5, further comprising:
   a plurality of external power supply voltage sections, each one arranged in relation to a corresponding one of the plurality of memory banks and adapted to provide an external power supply voltage to the corresponding memory bank when it enters into the DPD mode.

7. The DRAM of claim 6, wherein the external power supply voltage is applied to one or more boost voltage input terminals in a corresponding one of the plurality of memory banks when it enters into the DPD mode.

8. The DRAM of claim 3, wherein one or more boost voltage input terminals in a memory bank entering into the DPD mode is supplied with a voltage obtained by dropping a boost voltage generated by an enabled internal power supply voltage section by predetermined voltage level.

9. The DRAM of claim 3, wherein the DPD controller comprises:
   a DPD bank designating section adapted to provide a DPD bank designation signal to each one of the plurality of internal power supply voltage sections, wherein the DPD bank designation signal selectively enables/disable each one of the plurality of internal power supply voltage sections in response to a DPD command signal, and
   wherein a memory bank corresponding to a disabled internal power supply voltage section enters into the DPD mode.

10. The DRAM of claim 9, wherein each internal power supply voltage section comprises a boost voltage generator.

11. The DRAM of claim 9, wherein each internal power supply voltage section is electrically independent from all memory banks in the plurality of memory banks, except for the corresponding memory bank.

12. The DRAM of claim 11, further comprising:
    a plurality of external power supply voltage sections, each one arranged in relation to a corresponding one of the plurality of memory banks and adapted to provide an external power supply voltage to the corresponding memory bank when it enters into the DPD mode.

13. The DRAM of claim 12, wherein the external power supply voltage is applied to one or more boost voltage input terminals in a corresponding one of the plurality of memory banks when it enters into the DPD mode.

14. The DRAM of claim 13, wherein the external power supply voltage section comprises an NMOS transistor connected between an external power supply voltage and a boost voltage input terminal for a corresponding memory bank having entered into the DPD mode, wherein the NMOS transistor is gated by the DPD bank designation signal.

15. The DRAM of claim 9, wherein one or more boost voltage input terminals in a memory bank entering into the DPD mode is supplied with a voltage obtained by dropping a boost voltage generated by an enabled internal power supply voltage section by predetermined voltage level through a voltage dropping section.

16. The DRAM of claim 15, wherein the voltage dropping section comprises a plurality of NMOS transistors connected in parallel between an enabled internal power supply voltage section and a boost voltage input terminal for a corresponding memory bank having entered into the DPD mode, wherein each NMOS transistor is gated by the boost voltage applied to the boost voltage terminal.

17. The DRAM of claim 9, further comprising:

a DPD entry signal generator adapted to provide the DPD command signal in response to control signals.

18. The DRAM of claim 9, wherein the DPD bank designating section provides a DPD bank designation signal in response to a predetermined address signal.

19. A communication terminal comprising:
  an integrated processor adapted to process communication data and multimedia data; and
  a dynamic random access memory (DRAM) adapted to receive and temporarily store data associated with the integrated processor, wherein the DRAM comprises a plurality of memory banks, each one independently supplied with a power supply voltage and adapted to operate in a deep power down (DPD) mode, and a DPD controller adapted to select a memory bank from the plurality of memory banks to enter into the DPD mode.

20. The communication terminal of claim 19, wherein some memory banks in the plurality of memory banks enter into the DPD mode when the integrated processor is not processing multimedia data.

21. The communication terminal of claim 20, wherein the DRAM further comprises:
  a plurality of internal power supply voltage sections, each one arranged in relation to a corresponding one of the plurality of memory banks and adapted to provide an internal power supply voltage thereto; and,
  wherein the DPD controller is further adapted to selectively disable each one of the internal power supply voltage sections and thereby cause the corresponding memory bank to enter into the DPD mode.

* * * * *